United States Patent
Zhu et al.

(10) Patent No.: US 10,930,545 B2
(45) Date of Patent: Feb. 23, 2021

(54) METHOD FOR FORMING SEMICONDUCTOR STRUCTURE

(71) Applicant: Nexchip Semiconductor Corporation, Anhui (CN)

(72) Inventors: Hongbo Zhu, Anhui (CN); Yi Zhang, Anhui (CN)

(73) Assignee: Nexchip Semiconductor Corporation, Anhui (CN)

( * ) Notice: Subject to any disclaimer, the term of this patent is extended or adjusted under 35 U.S.C. 154(b) by 0 days.

(21) Appl. No.: 16/455,144

(22) Filed: Jun. 27, 2019

(65) Prior Publication Data
US 2020/0365446 A1    Nov. 19, 2020

(30) Foreign Application Priority Data
May 13, 2019   (CN) .......................... 201910394693.X

(51) Int. Cl.
*H01L 21/762*   (2006.01)
*H01L 21/033*   (2006.01)
*H01L 29/06*    (2006.01)

(52) U.S. Cl.
CPC .... *H01L 21/76224* (2013.01); *H01L 21/0332* (2013.01); *H01L 21/0337* (2013.01); *H01L 29/0649* (2013.01)

(58) Field of Classification Search
CPC ...................... H01L 21/76224; H01L 29/0649
See application file for complete search history.

(56) References Cited

U.S. PATENT DOCUMENTS 6,242,788 B1 * 6/2001 Mizuo ................ H01L 21/3065
                                                                257/506

* cited by examiner

*Primary Examiner* — Jay C Chang
*Assistant Examiner* — Mikka Liu
(74) *Attorney, Agent, or Firm* — Muncy, Geissler, Olds & Lowe, P.C.

(57) ABSTRACT

A method for forming a semiconductor structure is disclosed. Among a stack of mask layers, any other layers above the lowermost thin film layer are subsequently removed to expose the lowermost thin film layer and then the lowermost thin film layer is separately removed by a dry etching process. This improves an etching uniformity of the lowermost thin film layer and ameliorates the issue of material residues. Moreover, thanks to the anisotropic characteristic of the dry etching process, lateral etching of side walls of a trench isolation structure can be mitigated.

9 Claims, 3 Drawing Sheets

METHOD FOR FORMING SEMICONDUCTOR STRUCTURE

CROSS-REFERENCE TO RELATED APPLICATION

This application claims the priority of Chinese patent application number 201910394693.X, filed on May 13, 2019, the entire contents of which are incorporated herein by reference.

TECHNICAL FIELD

The present invention relates to the field of semiconductor technology, and in particular, to a method for forming a semiconductor structure.

BACKGROUND

In semiconductor processes, individual semiconductor devices are typically isolated by trench isolation structures such as shallow trench isolation (STI) structures. During semiconductor device fabrication, trench isolation structures are often preferred to be formed in an early phase so as to define a plurality of cell regions, thereby forming semiconductor devices in respective cell regions in a subsequent phase.

Currently, during the fabrication of such a trench isolation structure, mask layers are typically stacked on the surface of a substrate so as to define the position and shape of the trench isolation structure. And subsequent to the fabrication of the trench isolation structure, the mask layers are removed so as to expose the substrate surface. In a conventional process, the mask layers are removed within a single wet etching step.

FIG. 1 is a schematic representation of a structure resulting from the removal of the mask layers in the conventional process. However, as shown in FIG. 1, existing etching techniques tend to be incapable of complete removal of the layers. In particular, when the resulting trench isolation structure 20 protrudes beyond the top surface of the so-processed substrate 10, residues from the mask layers are often found at the corners between the side walls of the trench isolation structure 20 and the top surface of the substrate 10. A specific example of which is the beak-like portions circled by the respective dashed ovals in FIG. 1.

Although complete removal of the mask layers can be ensured by extending the wet etching time, this will, however, on the other hand, raise the risk of eroding an insulating material in the trench isolation structure and hence impairing the isolating performance of the trench isolation structure. Therefore, further improvements are necessary for the current mask layer removal approaches.

SUMMARY OF THE INVENTION

It is an object of the present invention to present a method for forming a semiconductor structure so as to overcome the afore-described problems with the conventional methods, i.e., easy leaving of mask material residues or possible eroding of the trench isolation structure because of over-etching.

To this end, the present invention provides a method for forming a semiconductor structure, comprising:

providing a substrate in which at least one trench isolation structure is formed, and forming a mask multilayer on a substrate surface of a peripheral of the trench isolation structure;

removing a partial layer in the mask multilayer until exposing a lowermost thin film layer; and performing a dry etching process so as to remove the lowermost thin film layer.

Optionally, removing a partial layer in the mask multilayer until exposing the lowermost thin film layer may comprise:

removing at least a part of the mask multilayer by a wet etching process.

Optionally, the mask multilayer may comprise the lowermost thin film layer formed on the substrate and a hard mask layer formed above the lowermost thin film layer.

Optionally, the hard mask layer may be made of a material containing silicon nitride and/or polycrystalline silicon (poly-Si).

Optionally, the method may further comprise, subsequent to the exposure of the first lowermost thin film layer and prior to the performing of the dry etching process:

forming a shielding layer above the substrate, wherein the shielding layer covers the trench isolation structure and the lowermost thin film layer is exposed; and etching the lowermost thin film layer with the shielding layer serving as a mask during the dry etching process.

Optionally, the substrate may comprise a device region and a logic region, wherein the trench isolation structures are formed in the device region to define a plurality of device cells.

Optionally, the shielding layer may further cover the logic region.

Optionally, the formation of the trench isolation structure may comprise:

etching the substrate with the mask multilayer serving as a mask to form an isolation trench, filling an insulating material layer in the isolation trench to form the trench isolation structure; and performing an oxidation process, prior to the filling of the insulating material, to form an oxide liner on internal walls of the isolation trench.

Optionally, the lowermost thin film layer may be made of a material containing silicon oxide.

Optionally, the method may further comprise, subsequent to the removal of the lowermost thin film layer and hence the exposure of the substrate surface:

forming a tunneling oxide layer on the substrate surface, thereby forming a semiconductor device.

In this method, during removal of the mask multilayer, the lowermost thin film layer is first retained, with any other overlying layer being removed, and then separately removed by an anisotropic dry etching process. This can improve etching accuracy and uniformity of the lowermost thin film layer and avoid residues from the material of the thin film layers leaving. As a result, a good substrate surface condition can be created for the subsequent fabrication of semiconductor devices, which is favorable to improve the performance of the resulting devices.

In addition, thanks to the anisotropic characteristics of the dry etching process, lateral etching of side walls of the trench isolation structure can be effective reduced. Thus, less cavities will be present in the insulating material layer of the trench isolation structure, ensuring that the trench isolation structure offers a better isolation performance.

LIST OF REFERENCE NUMERALS IN DRAWINGS

10/100 Substrate
20/200 Trench Isolation Structure
210 Isolation Trench
220 Oxide Liner
230 Insulating Material Layer
300 Mask Multilayer
310 Lowermost Thin Film Layer
320 Hard Mask Layer
400 Shielding Layer

DETAILED DESCRIPTION

As stated in the Background section, the conventional techniques are faced with the dilemma that, during the removal of mask multilayer, a short etching time tends to lead to an incomplete removal of the layers, while a long etching time may lead to an erosion of the insulating material in the trench isolation structure.

In view of these problems, the inventors have found, after intensive research efforts, that it is just the isotropic characteristic of wet etching that causes easy leaving of mask material residues at the corners where the trench isolation structure interfaces with the substrate surface. An extended etching time can address the issue of residues, but the etchant will erode laterally deeper into the insulating material of the trench isolation structure because of the isotropic characteristic of the wet etching, thereby affecting the trench isolation structure.

In view of this, the present invention provides a method for forming a semiconductor structure, comprising:

providing a substrate in which at least one trench isolation structure is formed, and on the surface of the substrate there are mask layers stacked around the trench isolation structure;

removing partial layer in the mask multilayer to a lowermost thin film layer so as to expose the lowermost thin film layer; and performing a dry etching process so as to remove the lowermost thin film layer.

In this method, among the mask multilayer, the lowermost thin film layer is etched away in a separate step from removal of all the other layer(s). That is, the lowermost one of the mask multilayer is allowed to be separately etched, particularly by a dry etching process. In particular, during the dry etching process, the etchant can etch the lowermost thin film layer in a vertical direction such that the lowermost thin film layer is gradually dissolved in a height direction. This can facilitate uniform etching of the lowermost thin film layer and avoid material residues at the corners where the trench isolation structure interfaces with the substrate surface. In addition, lateral etching that may lead to loss of insulating material in the trench isolation structure can be effectively suppressed, thus the erosion of the trench isolation structure can be reduced.

The method proposed herein will be described in greater detail with reference to the accompanying drawings as well as to specific embodiments. Advantages and features of the invention will appear clearer from the following description. Note that the figures are much simplified and may not be drawn to scale, and their sole purpose is to facilitate easy and clear explanation of the following embodiments.

Figure 1:
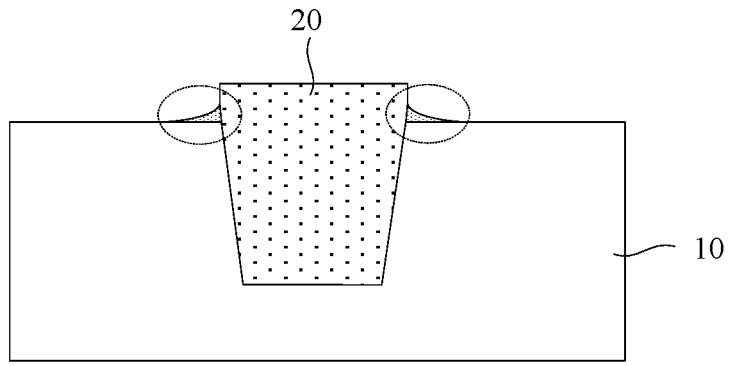
FIG. 1 is a schematic illustration of a structure resulting from the removal of mask multilayer in a conventional method.
Figure 2:
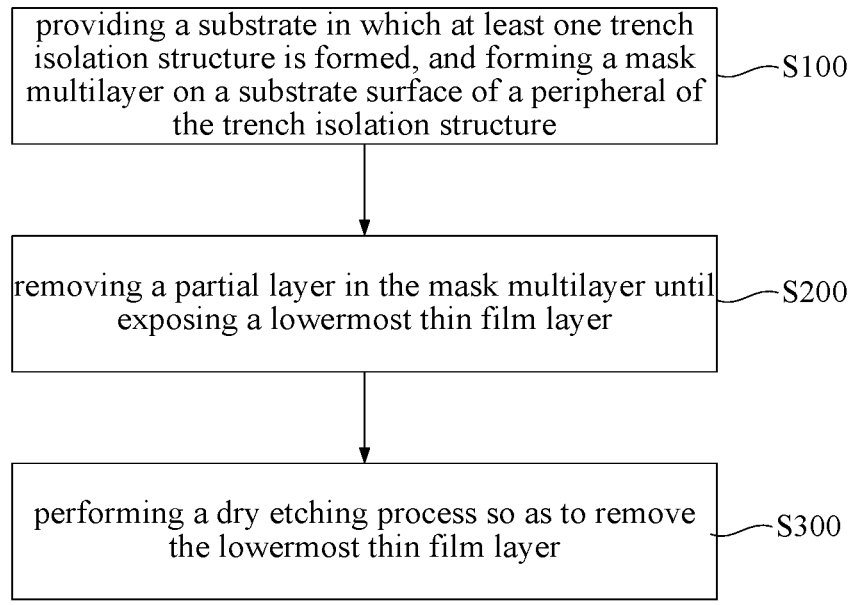
FIG. 2 is a flowchart of a method for forming a semiconductor structure in accordance with an embodiment of the present invention.

FIG. 2 is a flowchart of a method for forming a semiconductor structure in accordance with an embodiment of the present invention, and FIGS. 3a to 3e are schematic illustrations of intermediate structures formed during the formation of the semiconductor structure.

Figure 3A:
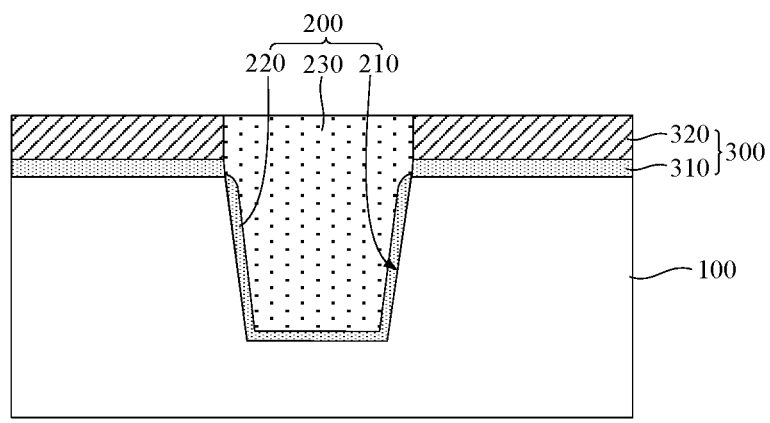
FIGS. 3a to 3e are schematic illustrations of intermediate structure formed during the formation of a semiconductor structure in accordance with an embodiment of the present invention.

In step S100, referring specifically to FIG. 3a, a substrate 100 such as, for example, a silicon substrate, is provided, in which at least one trench isolation structure 200 is formed, and on the surface of the substrate there are mask layers 300 stacked around the trench isolation structure 200.

It can be considered that the mask multilayer 300 define the position and shape of the trench isolation structure 200. The mask multilayer 300 may comprise at least two mask layers that are stacked one above another. In the illustrated embodiment, the mask multilayer 300 include a lowermost thin film layer 310 formed on the substrate surface and a hard mask layer 320 on the lowermost thin film layer 310. Of course, in other embodiments, the mask multilayer 300 may also include one or more other layers such as a carbon-containing layer.

The lowermost thin film layer 310 may be, for example, an oxide layer. Further, the lowermost thin film layer 310 may be made of a material containing silicon oxide. The hard mask layer 320 may be made of a material containing, for example, silicon nitride (SiN) and/or polycrystalline silicon (poly-Si). It should be noted that the hard mask layer 320 may either be a single-layer structure, such as a monolithic SiN or poly-Si layer, or a laminated structure, such as a SiN and poly-Si laminate.

In other words, in the illustrated embodiment, the hard mask layer 320 is disposed above the substrate 100, with the lowermost thin film layer 310 interposed therebetween. In this way, stress on the substrate 100 from the hard mask layer 320 can be relieved. In particular, in case of the hard mask layer 320 being made of SiN, direct disposition of SiN on the silicon substrate would exert significant stress on the substrate. In the illustrated embodiment, the lowermost thin film layer 310 formed between the hard mask layer 320 and the substrate 100 may be implemented as an oxide layer. By using the oxide layer as a buffer layer, the stress can be relieved.

As noted above, in the illustrated embodiment, the mask multilayer 300 define the position and shape of the trench isolation structure 200. This means that the mask multilayer 300 are patterned in correspondence with the trench isolation structure. Specifically, a process for forming the trench isolation structure 200 based on the mask multilayer 300 may comprise the following steps.

In a first step, the substrate 100 is etched with the mask multilayer 300 serving as a mask so as to form an isolation trench 210.

In the illustrated embodiment, for example, the hard mask layer 320 may be used as a mask for the etching process which proceeds through the lowermost thin film layer 310 into the substrate 100, thereby forming the isolation trench 210. That is, the isolation trench 210 extends through the hard mask layer 320 and the lowermost thin film layer 310 and into the substrate 100.

With continued reference to FIG. 3a, in the illustrated embodiment, the isolation trench 210 may be tapered from the open top downward so as to have two slanted side walls, which are favorable to the subsequent filling of an insulating material into the isolation trench 210 with a higher efficiency and no formation of cavities.

Optionally, referring specifically to FIG. 3a, subsequent to the formation of the isolation trench 210 by etching the substrate 100, the process may further include performing a thermal oxidation process for forming an oxide liner 220 over the internal walls of the isolation trench 210. In the illustrated embodiment, since the substrate 100 is silicon, the thermal oxidation process can result in a self-aligned oxide liner 220 formed on the internal walls of the isolation trench 210.

It should be noted that, during the formation of the isolation trench 210 by etching the substrate, damages may occur to the internal side and bottom walls of the isolation trench 210 and may be subsequently repaired by the formation of the oxide liner 220. Additionally, the formation of the oxide liner 220 may eliminate any sharp portions of the isolation trench 210 so that, for example, the acute bottom corners of the isolation trench 210 are rounded. As a result, the issue of easier breakdown at such sharp portions due to concentrated electric fields there can be alleviated.

In a second step, an insulating material layer 230 is filled into the isolation trench 210 to form the trench isolation structure 200.

Specifically, a process for filling the insulating material layer 230 in the isolation trench 210 may include the following steps.

First, the insulating material is filled in the isolation trench 210 by deposition or spin coating until it also covers the top surface of the hard mask layer 320. In order to achieve a good filling effect, the insulating material may be deposited, for example, by a high density plasma (HDP) process.

Next, a chemical mechanical polishing/planarization (CMP) process is performed to remove the insulating material deposited higher than the top surface of the hard mask layer 320.

In this way, the trench isolation structure 200 is formed, with the insulating material being filled in the isolation trench 210 and the top surface of the insulating material layer being flush with the top surface of the hard mask layer 320.

In specific examples, a device region and a logic region may be defined in the substrate 100. Trench isolation structures 200 may be formed in the device region to define multiple active areas in which various semiconductor devices may be subsequently fabricated. The semiconductor devices may include, for example, transistors. The logic region may be located, for example, around the device region, so as to form logic control circuitry.

Figure 3B:
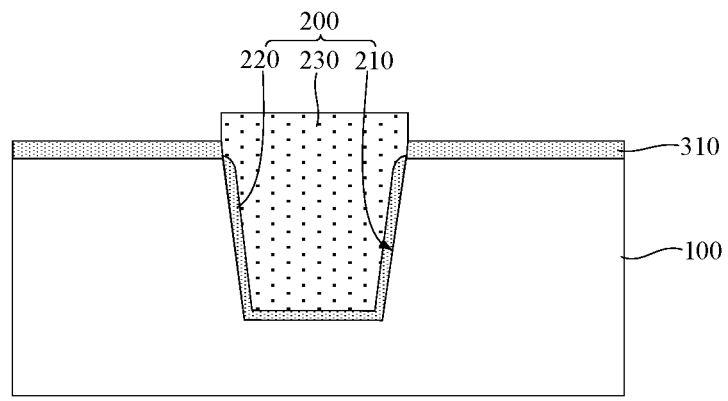

In step S200, referring specifically to FIG. 3b, the lowermost thin film layer 310 is exposed by removing any other one of the mask multilayer 300 thereabove. In other words, any other layer overlying the lowermost thin film layer is first removed, and the lowermost thin film layer is remained. Then the lowermost thin film layer is separately etched. This can facilitate the etching accuracy of the lowermost thin film layer 310.

Exposing the lowermost thin film layer 310 of the mask multilayer 300 by removing any other one thereabove may include removing at least part of the mask multilayer by a wet etching process.

For example, in the illustrated embodiment, the hard mask layer 320 may be removed by a wet etching process, in particular, when it is either a monolithic SiN or poly-Si layer structure or a SiN and poly-Si laminate structure.

It should be noted that, since silicon nitride can be etched at a very high rate by a wet etching process, removing the hard mask layer 320 containing silicon nitride by a wet etching process is desirable because of a high removal efficiency.

Further, in the wet etching process, an etchant exhibiting a relative great etching selectivity of the hard mask layer 320 to the lowermost thin film layer 310 may be chosen. For example, when the materials of the hard mask layer 320 and the lowermost thin film layer 310 contains silicon nitride and silicon oxide, respectively, phosphoric acid or the like can be chosen as the etchant to remove silicon nitride while minimizing the loss of silicon oxide in the lowermost thin film layer.

Of course, in other embodiments, when the mask multilayer 300 further include, for example, a carbon-containing layer, an ashing process can be employed to remove the carbon-containing layer.

Figure 3C:
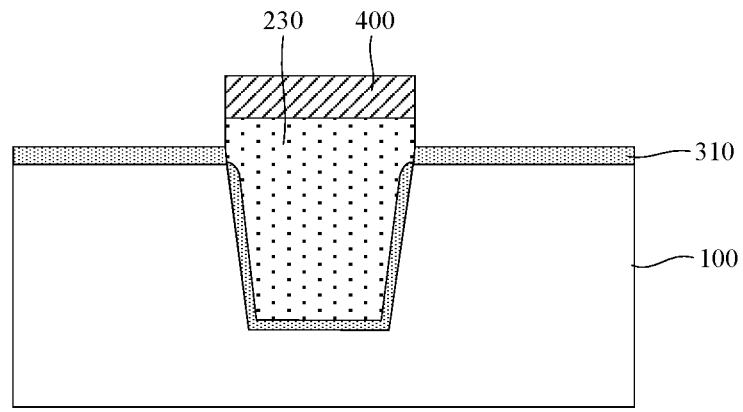
Figure 3D:
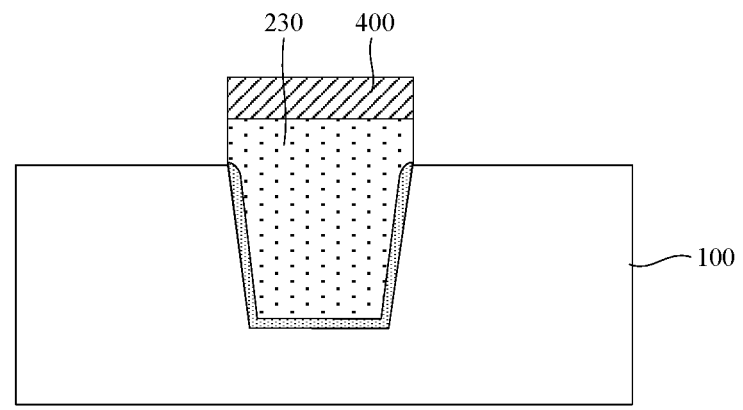

In step S300, referring specifically to FIGS. 3c-3d, a dry etching process is performed to remove the lowermost thin film layer 310. That is, the only remainder of the mask multilayer, i.e., the lowermost thin film layer 310, is separately removed by the dry etching process. This is favorable to improving the etching accuracy and uniformity of the lowermost thin film layer 310 and avoiding portions of the lowermost thin film layer 310 adjacent to the trench isolation structure from remaining.

It should be noted that, in contrast to a wet etching process which is isotropic, the dry etching process is an anisotropic process in which the etchant etches and dissolves the lowermost thin film layer 310 vertically with a higher uniformity.

Referring to FIG. 3d, the insulating material 230 protrudes beyond the substrate surface, and so there are corners between the top surface of the substrate and side walls of the insulating material layer 230. As discussed in the Background section, if a wet etching process is used to remove the lowermost thin film layer, then a short etching time will tend to leave residues around the corners, while an increased etching time may cause the etchant to laterally etch the side walls of the trench isolation structure and create cavities in the insulating material layer of the trench isolation structure.

On the contrary, the dry etching process for removing the lowermost thin film layer 310 in the illustrated embodiment can, on the one hand, improve etching uniformity of the lowermost thin film layer 310 and mitigate the issue of residues around the corners, and on the other hand, ensure complete removal of the lowermost thin film layer 310 even upon fine adjustments in etching time. Differing from the isotropic wet etching, an anisotropic dry etching can effectively avoid the etchant from laterally etching side walls of the insulating material layer 230 in the trench isolation structure 200 and thus protect the isolating performance of the trench isolation structure 200.

Optionally, referring specifically to FIG. 3c, the method may further include, prior to the dry etching process: forming a shielding layer 400 over the substrate, which covers the trench isolation structure 200 but not the lowermost thin film layer 310. Examples of the shielding layer 400 may include photoresist.

The shielding layer 400 covering insulating material layer 230 of the trench isolation structure 200 can serve as a mask in the subsequent dry etching process for separate removal of the lowermost thin film layer 310, which prevents the insulating material layer 230 in the trench isolation structure from being affected during the process.

Moreover, in specific examples with a logic region in the substrate 100, as mentioned above, the shielding layer 400 may further cover this logic region (not shown) and protect the logic region against possible damage in the subsequent process.

Figure 3E:
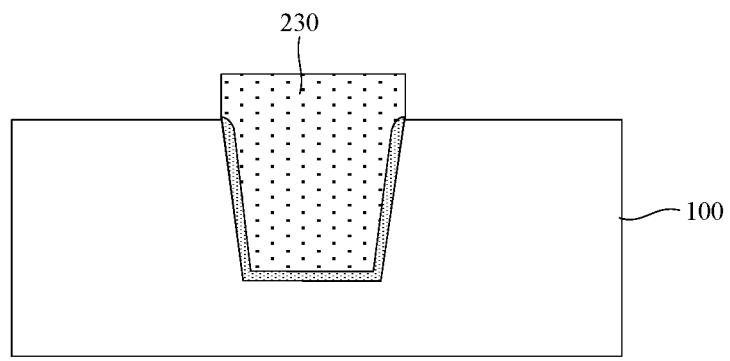

Additionally, referring specifically to FIG. 3e, the shielding layer may be removed following the removal of the lowermost thin film layer.

It should be recognized that uniform removal of the lowermost thin film layer without any residue left on the substrate surface provides a good substrate surface condition to the subsequent fabrication of individual semiconductor devices and thus contributes to good performance of these devices.

For example, trench isolation structures 200 may be formed to define a plurality of active areas in which transistors can be fabricated. In this case, after the surface of the substrate 100 is exposed, a tunneling oxide layer may be formed thereon. As the substrate surface is clean without any residue, the tunneling oxide layer may be uniformly formed, which is favorable to the performance of the transistors being fabricated.

Specifically, when side walls of the trench isolation structure are laterally etched, or when there are residues left at the corners between the trench isolation structure and the substrate surface, differences will appear between a central portion of the tunneling oxide layer and its peripheral portions and make threshold voltages of the resulting transistors unstable (e.g., a so-called double hump behavior). With the method according to the illustrated embodiment, it can be ensured that there will be no residue left on the substrate surface and that lateral etching of the side walls of the trench isolation structure will not happen. This is favorable to the elimination of the double hump phenomenon of the formed transistors.

In summary, in the semiconductor structure method of the present invention, among the mask multilayer, the lowermost thin film layer is retained, with any other overlying layer being removed, and then separately removed by a dry etching process. This can improve an etching accuracy and uniformity of the lowermost thin film layer and avoid portions of the lowermost thin film layer adjacent to the trench isolation structure from remaining. Due to the anisotropic characteristics of the dry etching process, lateral etching of the side walls of the trench isolation structure can be effectively mitigated even when there are fine adjustments in the etching time. This enables a good substrate surface condition for the subsequent fabrication of semiconductor devices so as to improve the performance of the resulting semiconductor devices as well as provides a good isolation for respective semiconductor devices by the trench isolation structure.

Described above are merely some specific embodiments of the present invention whose scope is, however, not limited to these disclosed embodiments. It is intended that all changes and substitutions made by those of ordinary skill in the art in light of the teachings disclosed herein fall within the scope of the appended claims.

What is claimed is:

1. A method for forming a semiconductor structure, comprising:
   providing a substrate in which at least one trench isolation structure is formed, and forming a mask multilayer on a substrate surface of a peripheral of the trench isolation structure;
   removing a partial layer in the mask multilayer until exposing a lowermost thin film layer; and
   performing a dry etching process so as to remove the lowermost thin film layer;
   wherein subsequent to the exposure of the lowermost thin film layer and prior to the performing of the dry etching process, the method further comprises:
   forming a shielding layer above the substrate, wherein the shielding layer covers the trench isolation structure and the lowermost thin film layer is exposed; and
   etching the lowermost thin film layer with the shielding layer serving as a mask during the dry etching process.

2. The method as claimed in claim 1, wherein removing a partial layer in the mask multilayer until exposing a lowermost thin film layer comprises:
   removing at least a part of the mask multilayer by a wet etching process.

3. The method as claimed in claim 1, wherein the mask multilayer comprises the lowermost thin film layer formed on the substrate and a hard mask layer formed above the lowermost thin film layer.

4. The method as claimed in claim 3, wherein the hard mask layer is made of a material containing silicon nitride and/or polycrystalline silicon.

5. The method as claimed in claim 1, wherein the substrate comprises a device region and a logic region, and wherein the at least one trench isolation structure is formed in the device region to define a plurality of device cells.

6. The method as claimed in claim 5, wherein the shielding layer further covers the logic region.

7. The method as claimed in claim 1, wherein the formation of the trench isolation structure comprises:
   etching the substrate with the mask multilayer serving as a mask to form an isolation trench and filling an insulating material layer in the isolation trench to form the trench isolation structure; and
   performing an oxidation process, prior to the filling of the insulating material layer, to form an oxide liner on internal walls of the isolation trench.

8. The method as claimed in claim 1, wherein the lowermost thin film layer is made of a material containing silicon oxide.

9. The method as claimed in claim 1, further comprising, subsequent to the removal of the lowermost thin film layer and hence an exposure of the substrate surface:
   forming a tunneling oxide layer on the substrate surface, thereby forming a semiconductor device.

* * * * *